United States Patent [19]

Köhler

[11] 4,061,839
[45] Dec. 6, 1977

[54] WARNING DEVICE FOR INDICATING CRITICAL CONDITION OF STARTER BATTERIES IN VEHICLES

[75] Inventor: Werner Köhler, Stuttgart, Germany

[73] Assignee: Daimler-Benz Aktiengesellschaft, Germany

[21] Appl. No.: 295,489

[22] Filed: Oct. 6, 1972

[30] Foreign Application Priority Data

Oct. 9, 1971 Germany .............................. 2150477

[51] Int. Cl.² ............................................. H01M 10/48
[52] U.S. Cl. ......................................... 429/93; 73/453
[58] Field of Search .................. 136/182; 73/453, 452, 73/322.5, 305, 444, 441; 429/91, 92, 93

[56] References Cited

U.S. PATENT DOCUMENTS

| | | | |
|---|---|---|---|
| 1,764,254 | 6/1930 | Freas | 73/441 |
| 1,832,792 | 11/1931 | Sachs | 73/441 |
| 1,965,837 | 7/1934 | Herdeg | 136/182 |
| 2,125,219 | 7/1938 | Campbell | 136/182 |
| 2,310,700 | 2/1943 | Knight | 136/182 |
| 2,393,717 | 1/1946 | Speaker | 128/2 |
| 2,524,600 | 10/1950 | Raymond et al. | 73/453 |
| 2,580,670 | 1/1952 | Gilbert | 324/41 |
| 2,664,011 | 12/1953 | Boonshaft | 73/453 |
| 3,287,175 | 11/1966 | Teed | 136/182 |

Primary Examiner—Donald L. Walton
Attorney, Agent, or Firm—Craig & Antonelli

[57] ABSTRACT

A warning system for indicating a critical charge condition of starter batteries in vehicles, especially in motor vehicles which operate according to the hydrometer principle; a specially constructed float is movably arranged on the inside of an areometer housing connected with the inside of the battery housing by way of apertures in such a manner that a warning signal is adapted to be triggered when the float sinks to a predetermined height corresponding to a predetermined acid concentration.

25 Claims, 5 Drawing Figures

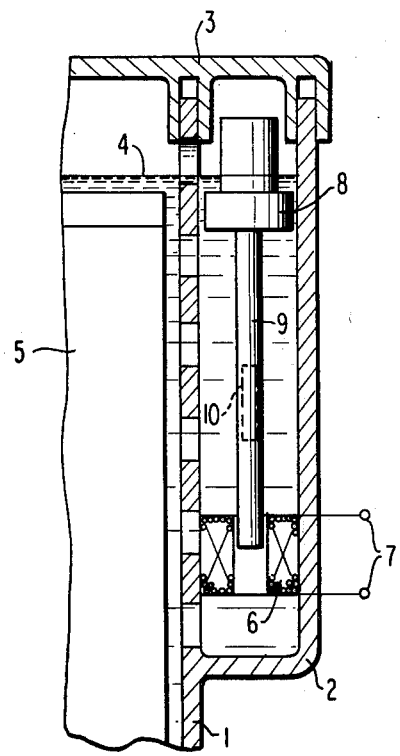
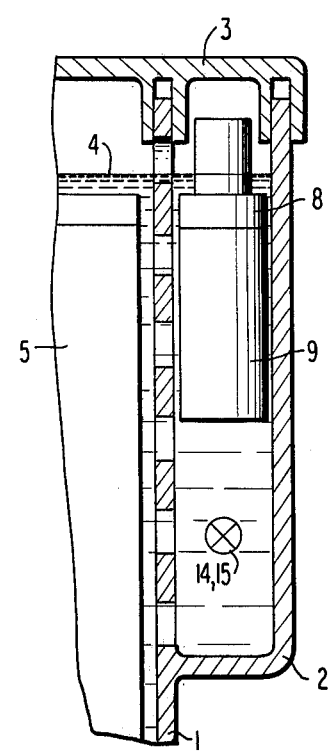
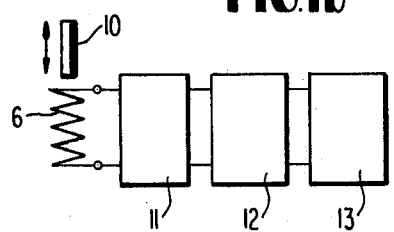
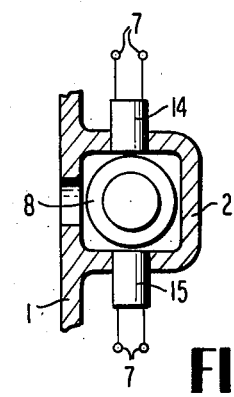
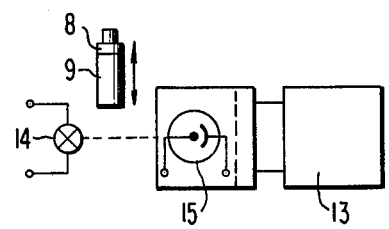

WARNING DEVICE FOR INDICATING CRITICAL CONDITION OF STARTER BATTERIES IN VEHICLES

The present invention relates to a warning device for indicating a critical charge condition of starter batteries in vehicles, especially in motor vehicles, according to the areometer or hydrometer priniciple.

When driving slowly, for example, in bumper-to-bumper formation, at which time many electrical loads such as headlights, heater blowers, rear window heater, windshield wipers, etc., are engaged simultaneously, it may happen that the generator can no longer fill the current requirements and the current requirement is therefore taken out of the starter battery of the vehicle. It may be possible thereby after a relatively short period of time that the vehicle drive comes to a standstill as a result of an excessively low ignition voltage, etc. and that the vehicle becomes stuck. For the sake of convenience the term "generator" is used herein to refer to both D.C. generators as well as so-called A.C. alternators as are currently used with motor vehicle charging systems.

It is the aim of the present invention to provide an installation which continuously monitors the charge condition of the starter battery and produces a warning signal upon reaching a critical charge condition.

The underlying problems are solved according to the present invention in that a specially constructed float is movable in an areometer housing disposed on the inside or outside of the battery housing and connected with the interior space thereof by apertures in such a manner that when the float drops to a predetermined height, corresponding to a predetermined value of acid density or acid concentration, a warning signal can be triggered.

Measuring apparatus are known in the art which indicate the battery voltage. However, these prior art apparatus are not suited for determining the charge condition because a battery, depending on the current magnitude during charging or discharging, assumes a respective different voltage. For purposes of determining the charge condition by way of the battery voltage, a complicated electronic system would be necessary. As a result thereof, an economically feasible utilization is precluded.

The installation therefore operates according to the present invention according to the areometer principle, in which the measurement of the acid density or acid concentration is utilized for the determination of the battery charge condition.

One embodiment according to the present invention is so constructed, that an iron core connected with the float is so arranged that with a sinking float, it immerses into an air coil disposed in the areometer housing and protected against the battery acid and thereby changes the inductance thereof.

The coil is a part of a tuned circuit of an oscillator connected to the tuned circuit. This tuned circuit becomes resonant at the predetermined frequency of the oscillator when the iron core immerses into the coil. This resonance signal is amplified in an amplifier connected in the output of the oscillator and triggers an acoustical and/or optical warning signal in an indicating device.

A critical charge condition of the battery is thereby indicated to the driver. By turning off unnecessary loads—for example, radio, rear window heater, heater blowers, etc.—the excessive load and consumption can be timely reduced and, under certain circumstances, the battery can be recharged and a getting-stuck of the vehicle can be avoided.

In a second embodiment of the present invention, a light barrier is mounted at a predetermined height of the areometer housing in such a manner that the light ray thereof is adapted to be interrupted by the float sinking into the battery acid.

The signal stemming from the light receiver of the light barrier triggers an acoustic and/or optical warning signal in an indicating device when the light ray is interrupted by the sinking float.

It is appropriate in all embodiments according to the present invention, that a delay element of any conventional type is connected in the input of the indicating device which prevents a triggering of a warning signal by reason of a sinking of the float member initiated by vibrations of the vehicle. Additionally, provision is made according to the present invention that the connections leading to the coil or to the light barrier are constructed as plug connections.

It is appropriate to construct, for example, the areometer housing with square cross section and the float member with round cross section or vice versa in order to prevent as much as possible a getting-stuck of the float member at the areometer housing.

Accordingly, it is an object of the present invention to provide a warning installation for indicating a critical charge condition of starter batteries in vehicles, especially motor vehicles, which avoids by simple means the aforementioned shortcomings and drawbacks encountered in the prior art.

Another object of the present invention resides in a warning system for indicating a critical charge condition of starter batteries in vehicles which is simple in construction, yet is highly reliable in operation.

A further object of the present invention resides in a warning system for indicating a critical charge condition of starter batteries in vehicles which indicates accurately such critical charge conditions without responding to possibly error signals caused by vibrations or movements of the vehicle.

Still another object of the present invention resides in a warning device for indicating a critical charge condition of starter batteries in vehicles which indicates when the generator of the vehicle is unable to fill the power requirements of the various vehicle loads, thus raising the possibility that the ignition voltage may become excessively low upon exhausting the battery.

A further object of the present invention resides in a warning system of the type described above which is not only relatively simple and inexpensive in construction but permits ready assembly of the individual parts.

These and further objects, features and advantages of the present invention will become more apparent from the following description when taken in connection with the accompanying drawing which shows, for purposes of illustration only, two embodiments in accordance with the present invention, and wherein:

FIG. 1a is a partial cross-sectional view through a first embodiment of a vehicle battery equipped with a warning device in accordance with the present invention including a coil and iron core;

FIG. 1b is a schematic circuit diagram of the circuit of the warning device in accordance with the present invention;

FIG. 2a is a partial cross-sectional view through a modified embodiment of a vehicle battery with a warning device in accordance with the present invention utilizing a light barrier;

FIG. 2b is a horizontal cross section through a part of the battery of FIG. 2a; and FIG. 2c is a schematic circuit diagram of the light barrier with adjoining circuit connected thereto for the device of FIGS. 2a and 2b.

Referring now to the drawing wherein like reference numerals are used throughout the various views to designate like parts, and more particularly to FIG. 1a, an embodiment with a coil and iron core is illustrated in this FIGURE in cross section. The areometer housing 2 is attached to or built onto the battery housing 1 which is provided within this area with apertures in order that the battery acid can reach the areometer housing 2. Both housings are closed off by means of a common cover 3. The lead plates 5 of the battery are indicated at the left in FIG. 1a and are covered with acid up to the filling level 4. An air coil protected against the battery acid by conventional means is disposed in the areometer housing 2, into which projects the float member 8 floating in the acid with its stem or shank 9. An iron core 10 is embedded in this shank or stem 9, also protected against acid.

If the battery is discharged, then the acid density or acid concentration becomes less and the float member 8 sinks ever lower. As a result thereof, the iron core 10 immerses into the coil 6 and changes in this manner the inductance thereof.

FIG. 1b indicates schematically a circuit connected thereto. The iron core 10 immerses into the coil 6 which is a part of a resonant circuit in the oscillator 11. As a result thereof, the tuned circuit becomes resonant. The oscillator therefore begins to generate a signal determined by the resonant frequency of its parameters, as is known in the art, and the resonance signal is amplified in the following amplifier 12 and triggers an acoustical and/or optical signal in the indicating device 13 of any conventional construction.

FIG. 2a illustrates in cross section an embodiment with a light barrier. As in FIG. 1a, there are again illustrated in FIG. 2a the battery housing 1, the areometer housing 2, the common cover 3, the filling level 4 of the battery acid and the lead plates 5. The float member 8 is equipped with a shank or stem 9 which, when the float member 8 sinks to a predetermined level, interrupts the light beam from the lamp 14 to the light receiver device 15. Conventional devices such as photocells, etc. may be used in connection with the light receiver 15.

FIG. 2b illustrates a horizontal cross section of the same arrangement as shown in FIG. 2a whereby a getting stuck on the part of the float member 8 at the housing 2 is prevented by the square cross section of the areometer housing 2 and of the round cross section of the float member 8.

A schematic diagram of the light barrier installation is illustrated in FIG. 2c. The light beam emitted by the lamp 14 is received by a light-receiving device 15 and is interrupted by the shank or stem 9 of the float member 8 when the latter sinks due to a decrease in the acid concentration when the battery is being discharged. With an interrupted light beam, a switching signal is triggered in the receiving device 15 and is possibly amplified. This switching signal triggers an acoustic and/or optical warning signal in the indicating device 13 again of conventional construction.

In order to prevent the triggering of a warning signal caused by a sinking of the float member 8 due to vibrations of the vehicle or other movements caused by road unevenesses, it is appropriate to connect a delay element of conventional construction in the input of the warning device 13 of FIG. 1b or FIG. 2c which prevents the triggering of the warning signal unless the predetermined condition on the part of the float member 8 lasts for a certain period of time as determined by the delay element. Furthermore, in order to simplify the installation of the warning system of the present invention, the connections 7 with the coil 6 or with the lamp 7 and with the photocell receiver 15 may be constructed as conventional plug-in connections.

Thus, the present invention operates according to the hydrometer principle by measuring the acid concentration of the battery liquid and triggering an acoustic and/or optical signal when the acid concentration drops below a predetermined value, as determined when the float member sinks to a predetermined depth.

While I have shown and described only two embodiments in accordance with the present invention, it is understood that the same is not limited thereto but is susceptible of numerous changes and modifications as known to those skilled in the art, and I therefore do not wish to be limited to the details shown and described herein but intend to cover all such changes and modifications as are encompassed by the scope of the appended claims.

What I claim is:

1. A warning installation for indicating a critical charge condition of starter batteries in vehicles, especially in motor vehicles, according to the areometer principle, characterized by an areometer housing means connected with the interior space of a battery housing means by way of aperture means, float means movable in said areometer housing means, a coil disposed in said areometer housing means and protected against the battery acid, warning means connected to said coil, a core of magnetizable material connected with said float means, said float means being arranged for sinking in said areometer housing when the acid concentration falls below a predetermined level so that said core is immersed within said coil, said coil being responsive to the immersing of said core therein for changing the inductance thereof and triggering said warning means to provide at least one of an acoustic and optical warning signal indicating that the acid concentration of the battery is below the predetermined level, the coil forming part of a tuned circuit of an oscillator means connected thereto, said tuned circuit being tuned to resonance upon immersion of the core into the coil, thereby causing the oscillator means to generate a signal with a frequency corresponding to the resonance of the tuned circuit, the signal being amplified in an amplifier connected in the output of the oscillator means and the amplified signal triggering a warning signal in an indicating means connected to the amplifier, a delay means being connected in front of the indicating means which prevents the triggering of a warning signal as a result of a sinking of the float means caused by vibrations.

2. A warning installation according to claim 1, characterized in that the connections leading to the coil are constructed as plug connections.

3. A warning installation according to claim 1, characterized in that only a single winding coil is disposed in said areometer housing means.

4. A warning installation according to claim 1, characterized in that the oscillator means generates a signal with a frequency corresponding to the resonance of the tuned circuit only when the core immerses in the coil for causing the tuned circuit to be tuned to resonance.

5. A warning installation for indicating a critical charge condition of starter batteries in vehicles, especially in motor vehicles, according to the areometer principle, characterized by an areometer housing means connected with the interior space of a battery housing means by way of aperture means, float means movable in said areometer housing means, a coil disposed in said areometer housing means and protected against the battery acid, warning means connected to said coil, a core of magnetizable material connected with said float means, said float means being arranged for sinking in said areometer housing when the acid concentration falls below a predetermined level so that said core is immersed within said coil, said coil being responsive to the immersing of said core therein for changing the inductance thereof and triggering said warning means to provide at least one of an acoustic and optical warning signal indicating that the acid concentration of the battery is below the predetermined level, and a delay means connected in front of an indicating means which prevents the triggering of a warning signal as a result of a sinking of the float means caused by vibrations.

6. A warning installation according to claim 5, characterized in that the connections leading to the coil are constructed as plug connections.

7. A warning installation for indicating a critical charge condition of starter batteries in vehicles, especially in motor vehicles, according to the areometer principle, characterized by an areometer housing means connected with the interior space of a battery housing means by way of aperture means, float means movable in said areometer housing means, said float means being arranged for triggering a warning signal when the float means sinks in said areometer housing means to a predetermined height corresponding to a predetermined acid concentration, and a delay means being connected in front of an indicating means for the warning signal for preventing the triggering of the warning signal as a result of a sinking of the float means caused by vibrations.

8. A warning installation according to claim 7, characterized in that the areometer housing means is disposed inside said battery housing means.

9. A warning installation according to claim 7, characterized in that the areometer housing means is disposed outside of said battery housing means.

10. A warning installation according to claim 7, characterized in that the indicating means produces an acoustical as well as optical warning signal.

11. A warning installation according to claim 7, characterized in that the coil is an air-core coil and the core is an iron core.

12. A warning installation according to claim 7, characterized in that a core of magnetizable material is connected with the float means in such a manner that with a sinking float means the core immerses into a coil disposed in the areometer housing means and protected against the battery acid and thereby changes the inductance thereof.

13. A warning installation according to claim 12, characterized in that only a single winding coil is disposed in said areometer housing means and said warning signal is provided when the acid concentration is below the predetermined level, the warning installation providing a continuous monitoring of the predetermined level.

14. A warning installation according to claim 13, characterized in that the warning signal is provided by a light being energized when the acid concentration is below the predetermined level.

15. A warning installation according to claim 12, characterized in that the coil forms part of a tuned circuit of an oscillator means connected thereto, said tuned circuit being tuned to resonance upon immersion of the core into the coil, thereby causing the oscillator means to generate a signal with a frequency corresponding to the resonance of the tuned circuit, the signal being amplified in an amplifier connected in the output of the oscillator means and the amplified signal triggering a warning signal in the indicating means coupled to the amplifier.

16. A warning installation according to claim 7, characterized in that a light barrier means is so mounted at a predetermined height of the areometer housing means that the light beam is adapted to be interrupted by the float means when sinking in the battery acid.

17. A warning installation according to claim 16, characterized in that the light barrier means includes a light receiver means producing a signal which triggers a warning signal in the indicating means when the light beam is interrupted by the sinking float means.

18. A warning installation according to claim 17, characterized in that the warning signal is at least one of acoustical and optical warning signals.

19. A warning installation according to claim 18, characterized in that the connections leading to the light barrier means are constructed as plug connections.

20. A warning installation according to claim 7, characterized in that said areometer housing means and said float means having different cross sectional shapes to minimize the danger of undue friction during movements of the float means.

21. A warning installation according to claim 20, characterized in that said areometer housing means has a substantially square cross section and the float means has a substantially circular cross section with a diametric dimension at most near equal to one side of the square.

22. A warning installation according to claim 20, characterized in that said areometer housing means is disposed inside said battery housing means.

23. A warning installation according to claim 20, characterized in that said areometer housing means is disposed outside of said battery housing means.

24. A warning installation according to claim 20, characterized in that a core of magnetizable material is connected with the float means in such a manner that with a sinking float means the core immerses into a coil disposed in the areometer housing means and protected against the battery acid and thereby changes the inductance thereof.

25. A warning installation according to claim 24, characterized in that the coil forms part of a tuned circuit of an oscillator means connected thereto, said tuned circuit being tuned to resonance upon immersion of the core into the coil, thereby causing the oscillator means to generate a signal with a frequency corresponding to the resonance of the tuned circuit, the signal being amplified in an amplifier connected in the output of the oscillator means and the amplified signal triggering a warning signal in an indicating means connected to the amplifier.

* * * * *